(12) United States Patent
Ai

(10) Patent No.: US 11,605,704 B1
(45) Date of Patent: Mar. 14, 2023

(54) CAPACITOR ARRAY AND METHOD FOR FORMING THE SAME

(71) Applicant: NANYA TECHNOLOGY CORPORATION, New Taipei (TW)

(72) Inventor: Tsu Chieh Ai, Taitung County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/450,290

(22) Filed: Oct. 8, 2021

(51) Int. Cl.
*H01L 49/02* (2006.01)
*H01L 27/108* (2006.01)

(52) U.S. Cl.
CPC ........ *H01L 28/91* (2013.01); *H01L 27/10805* (2013.01); *H01L 27/10852* (2013.01); *H01L 28/92* (2013.01)

(58) Field of Classification Search
CPC ......... H01L 27/10805; H01L 27/11551; H01L 28/40; H01L 28/60; H01L 28/90; H01L 28/91; H01L 28/92; H01L 27/10852
See application file for complete search history.

(56) References Cited

U.S. PATENT DOCUMENTS 10,910,468 B2 * 2/2021 Park .................. H01L 28/87
2013/0249053 A1 9/2013 Lee
2018/0175041 A1 * 6/2018 Kim .................. H01L 27/10814

* cited by examiner

*Primary Examiner* — Jose R Diaz
(74) *Attorney, Agent, or Firm* — CKC & Partners Co., LLC

(57) ABSTRACT

A capacitor array includes a substrate, first pedestal container stacked capacitors, second pedestal container stacked capacitors, and third pedestal container stacked capacitors. The first pedestal container stacked capacitors extend upwardly from above the substrate and are arranged in a first row. The second pedestal container stacked capacitors extend upwardly from above the substrate and are arranged in a second row next to the first row. The third pedestal container stacked capacitors extend upwardly from above the substrate and are arranged in a third row next to the second row. A first distance between the first and second rows is less than a second distance between the second and third rows.

10 Claims, 17 Drawing Sheets

CAPACITOR ARRAY AND METHOD FOR FORMING THE SAME

BACKGROUND

Field of Invention

The present disclosure relates to a capacitor array. More particularly, the present disclosure relates to a method for forming the capacitor array.

Description of Related Art

As dynamic random-access memories (DRAMs) increase in memory cell density, there is a continuing challenge to maintain sufficiently high storage capacitance despite decreasing cell area. Additionally, there is a continuing goal to further decrease cell area. The principal way for increasing cell capacitance is through cell structure techniques. Such techniques include three-dimensional cell capacitors, such as trenched or stacked capacitors. Moreover, the container structure can be classified as cylinder type or pedestal type structure. This disclosure concerns stacked capacitor cell constructions, including, pedestal container stacked capacitors.

SUMMARY

The disclosure provides a capacitor array.

In some embodiments, a capacitor array includes a substrate, first pedestal container stacked capacitors, second pedestal container stacked capacitors, and third pedestal container stacked capacitors. The first pedestal container stacked capacitors extend upwardly from above the substrate and are arranged in a first row. The second pedestal container stacked capacitors extend upwardly from above the substrate and are arranged in a second row next to the first row. The third pedestal container stacked capacitors extend upwardly from above the substrate and are arranged in a third row next to the second row. A first distance between the first and second rows is less than a second distance between the second and third rows.

In some embodiments, the capacitor array further includes a plurality of fourth pedestal container stacked capacitors extending upwardly from above the substrate and arranged in a fourth row next to the third row, a third distance between the third and fourth rows being less than the second distance between the second and third rows.

In some embodiments, the first distance is less than one-half of the second distance.

In some embodiments, the first pedestal container stacked capacitors are arranged at the same spacing in the first row.

In some embodiments, the second pedestal container stacked capacitors are arranged at the same spacing in the second row.

In some embodiments, the plurality of second pedestal container stacked capacitors each including a bottom electrode layer having a U-shaped cross section, a capacitor dielectric layer over the bottom electrode layer, and a top electrode layer over the capacitor dielectric layer.

In some embodiments, the capacitor array further includes a first capping layer laterally surrounding the first, second, and third pedestal container stacked capacitors.

In some embodiments, the top electrode layer of one of the plurality of second pedestal container stacked capacitors has a portion further penetrating through the first capping layer at a position laterally between the second and third rows.

In some embodiments, a top surface of the first capping layer is level with a top surface of the bottom electrode layer of the one of the plurality of second pedestal container stacked capacitors.

In some embodiments, the capacitor array further includes a second capping layer laterally surrounding the first, second, and third capacitors, the first capping layer being spaced apart from the second capping layer.

In some embodiments, a method for forming a capacitor array includes: depositing a first nitride layer, a first oxide layer, and a second nitride layer in sequence over first and second contacts on a substrate; etching the first nitride layer, the first oxide layer, and the second nitride layer to form first and second openings exposing the first and second contacts; conformally depositing a bottom electrode layer over the first nitride layer, the first oxide layer, and the second nitride layer and on the first and second contacts; forming a mask layer on a first portion of the bottom electrode layer above the first and second contacts, while leaving a second portion of the bottom electrode layer laterally between the first and second contacts exposed; with the mask layer in place, etching the second nitride layer and the first oxide layer to form a third opening having a bottom position higher than a top surface of the first nitride layer; after etching the second nitride layer and the first oxide layer, removing the mask layer from the bottom electrode layer; after removing the mask layer, removing the first oxide layer through the third opening; forming a capacitor dielectric layer over the bottom electrode layer; forming a top electrode layer over the capacitor dielectric layer.

In some embodiments, etching the second nitride layer and the oxide layer is performed by a dry etching process.

In some embodiments, removing the oxide layer is performed by a wet etching process.

In some embodiments, the wet etching process is performed to etch the oxide layer at a faster etch rate than it etches the first and second nitride layers.

In some embodiments, removing the mask layer is performed by a planarization process.

In some embodiments, the third opening non-overlaps the first and second contacts.

In some embodiments, when view from a cross section, the third opening has a greater dimension than the first and second openings.

In some embodiments, forming the capacitor dielectric layer over the bottom electrode layer is performed such that the capacitor dielectric layer is further formed on a sidewall of the third opening.

In some embodiments, the method further includes depositing a second oxide layer over the first and second contacts prior to depositing the first nitride layer, the first oxide layer, and the second nitride layer.

In some embodiments, the method further includes depositing an etch stop layer over the first and second contacts prior to depositing the first nitride layer, the first oxide layer, and the second nitride layer.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
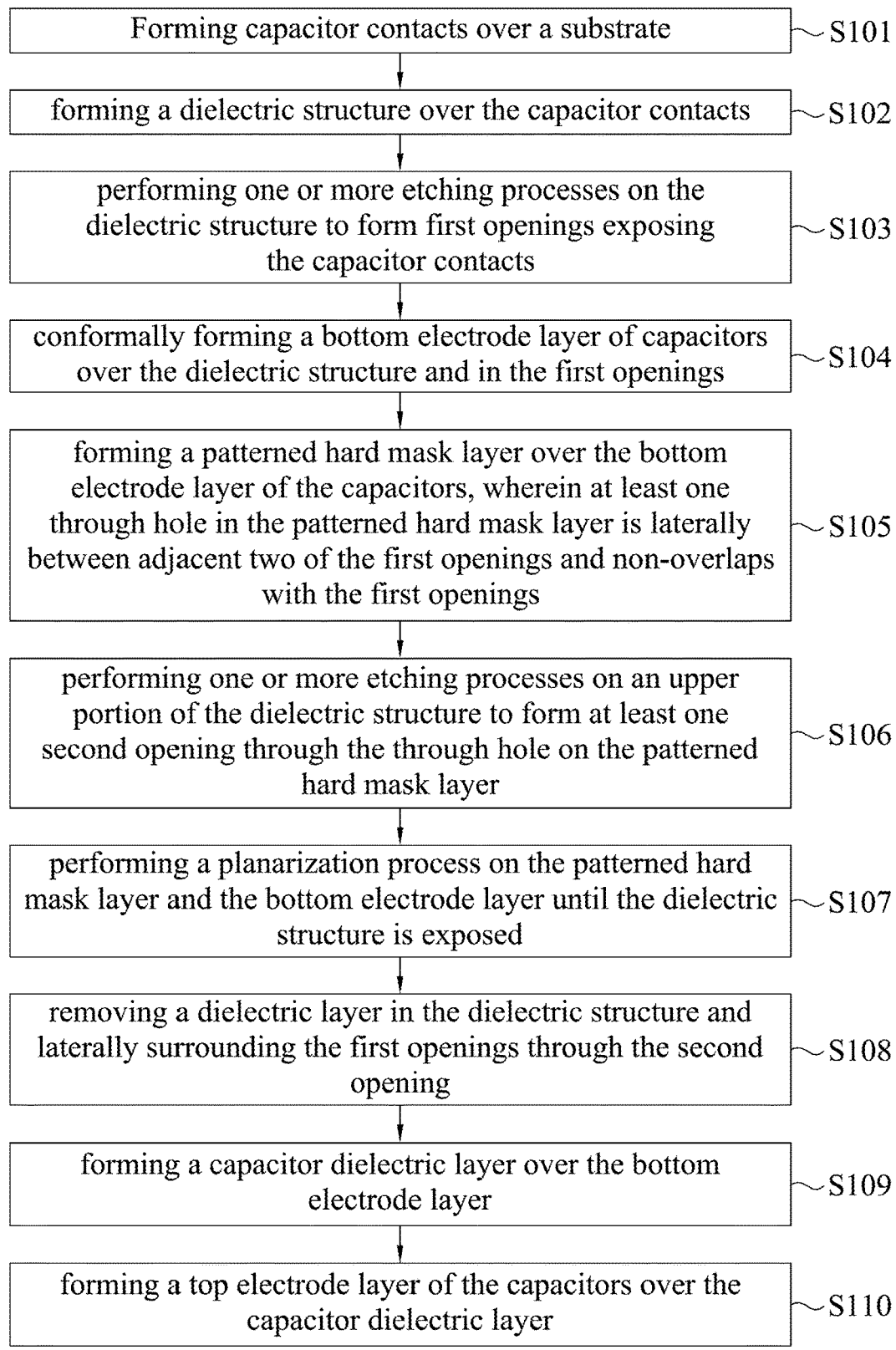
FIG. 1 is a method M of manufacturing a capacitor array in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 180 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

The present disclosure in various embodiments provides a capacitor array with pedestal container stacked capacitors. A method for fabrication of the capacitors includes forming a dielectric stack having two dielectric layers and a sacrificial layer between the two dielectric layers over capacitor contacts prior to forming the capacitors; and forming bottom electrode layers of the capacitors penetrating through the dielectric stack to land on the capacitor contacts. In order to increasing cell capacitance, the sacrificial layer will be removed through openings set on the upper dielectric layer in the dielectric stack and overlapping the capacitor contacts, which in turn increases the space to further fill the top electrode material of the capacitors therein to improve the capacitance. However, during the upper dielectric layer is etched to form the openings, the bottom electrode layers formed above the capacitor contacts may be damaged by the etching process, which in turn decreases the capacitance of the capacitors.

Therefore, the present disclosure in various embodiments provides a capacitor array having a capacitor pattern-dense region and a capacitor pattern-sparse region. The openings used to remove the sacrificial layer of the dielectric stack are formed in the capacitor pattern-sparse region to prevent the openings from forming above the capacitor contacts. As a result, during the upper dielectric layer is etched to form the openings, the bottom electrode layers formed above the capacitor contacts will not be damaged by the etching process, which in turn improves the capacitance of the capacitors.

Referring now to FIG. 1, illustrated is a flowchart of an exemplary method M for fabrication of a capacitor array in accordance with some embodiments. The method M includes a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable. The method M includes fabrication of the capacitor array A1. However, the fabrication of the capacitor array A1 is merely an example for describing the manufacturing process according to some embodiments of the present disclosure.

FIGS. 2A, 3A, 4A, 5A, 6A, 7A, 8A, and 9A illustrate schematic top views of a capacitor array A1 in accordance with some embodiments of the present disclosure. FIGS. 2B, 3B, 4B, 5B, 6B, 7B, 8B, and 9B illustrate cross sectional views along line A-A' of FIGS. 2A, 3A, 4A, 5A, 6A, 7A, 8A, and 9A.

Figure 2A:
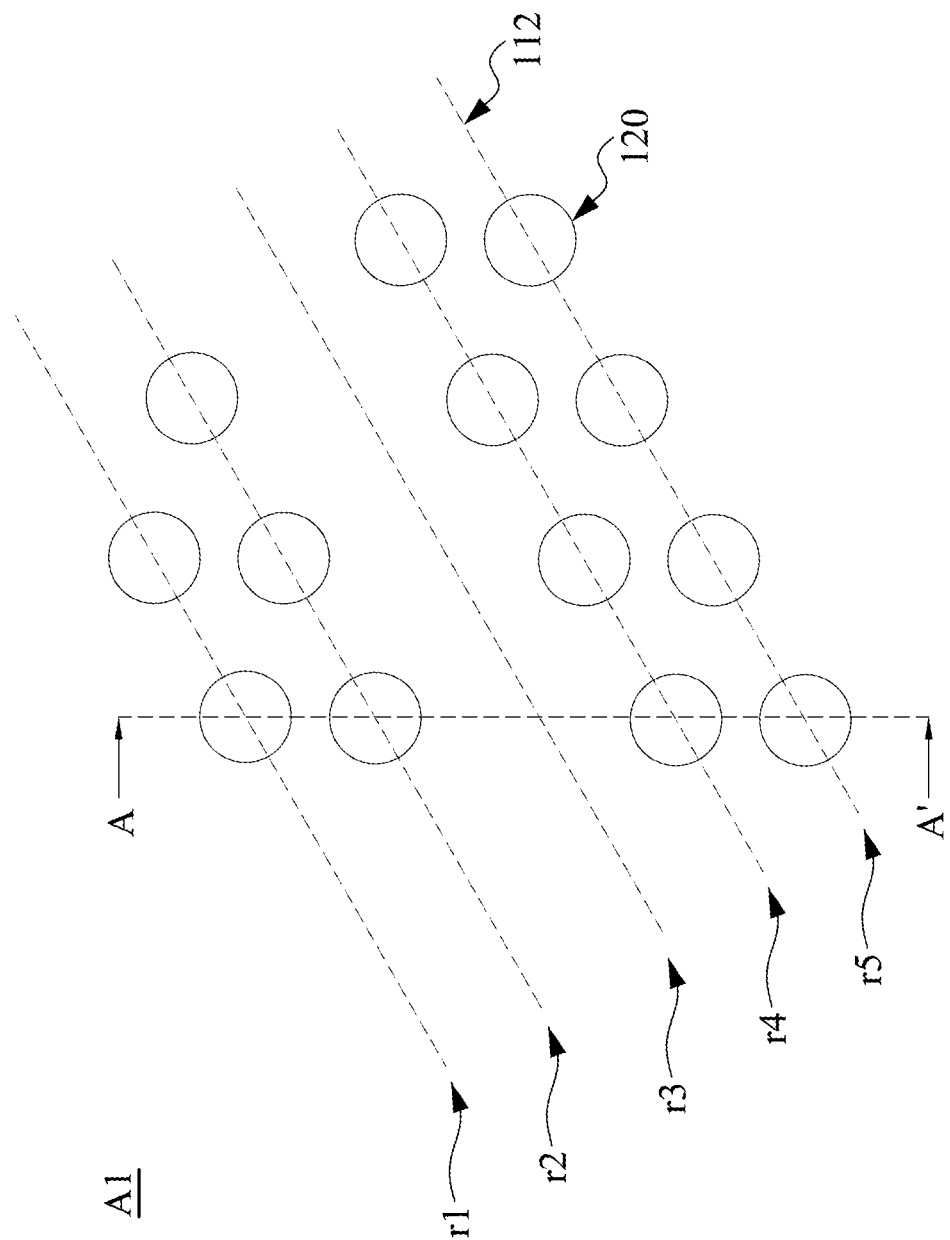
FIGS. 2A, 3A, 4A, 5A, 6A, 7A, 8A, and 9A illustrate schematic top views of a capacitor array in accordance with some embodiments of the present disclosure.
Figure 2B:
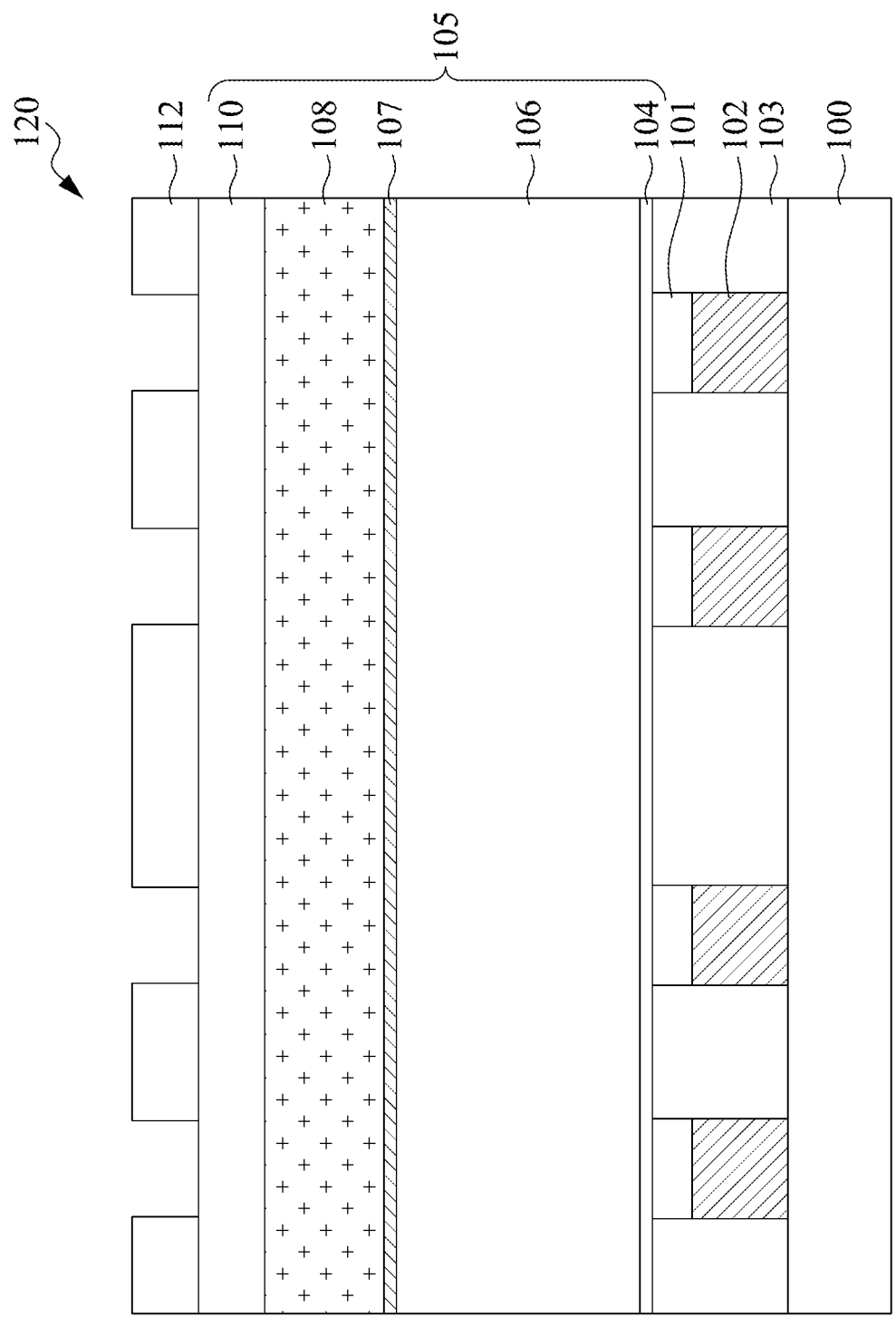
FIGS. 2B, 3B, 4B, 5B, 6B, 7B, 8B, and 9B illustrate cross sectional views along line A-A' of FIGS. 2A, 3A, 4A, 5A, 6A, 7A, 8A, and 9A.

The method M begins at block S101 where capacitor contacts are formed over a substrate. Referring to FIGS. 2A and 2B, in some embodiments of block S101, capacitor contacts 102 are formed over a substrate 100. The substrate 100 may be formed with the access metal-oxide-semiconductor (MOS) transistors (not shown) of the memory cells of the dynamic random-access memory (DRAM) beneath the level of the capacitor contacts 102. In some embodiments, the capacitor contacts 102 may include a conductive material such as, for example, copper (Cu), tungsten (W) cobalt (Co) or other suitable metals.

A dielectric material 103 are formed to laterally surround the capacitor contacts 102. In some embodiments, the dielectric material 103 may be formed of a dielectric material, such as silicon nitride, silicon oxide, silicon oxynitride, or the like. In some embodiments, a variety of suitable processes including chemical vapor depositions (CVD), low-pressure CVD (LPCVD), plasma-enhanced CVD (PECVD), physical vapor deposition (PVD), and atomic layer deposition (ALD) may be used to form the dielectric material 103.

A metal layer 101 are formed over the capacitor contacts 102 and having a different material than the capacitor contacts 102. In some embodiments, the metal layer 101 may include a conductive material such as, for example, copper (Cu), tungsten (W) cobalt (Co) or other suitable metals. In some embodiments, a variety of suitable processes including chemical vapor depositions (CVD), low-pressure CVD (LPCVD), plasma-enhanced CVD (PECVD), physical vapor deposition (PVD), and atomic layer deposition (ALD) may be used to form the metal layer 101.

Referring back to FIG. 1, the method M then proceeds to block S102 where a dielectric structure is formed over the capacitor contacts. With reference to FIGS. 2A and 2B, in some embodiments of block S102, a dielectric structure 105 may include a stack of an etch stop layer 104, a first dielectric layer 106, a second dielectric layer 107, a sacrificial layer 108, and a third dielectric layer 110 formed in sequence. Subsequently, a first patterned hard mask layer 112 having capacitor opening patterns 120 may be formed over the dielectric structure 105. As shown in FIG. 2A, the capacitor opening patterns 120 are arranged in rows r1, r2, r4, and r5 that are in parallel with each other. The capacitor opening patterns 120 have circle top-view patterns. In some embodiments, the capacitor opening patterns 120 may have a square top-view pattern, a rectangular top-view pattern, or an elliptical top-view pattern.

In some embodiments, the etch stop layer 104 may be formed of a dielectric material, such as silicon nitride, silicon oxide, silicon oxynitride, or the like. In some embodiments, a variety of suitable processes including chemical vapor depositions (CVD), low-pressure CVD (LPCVD), plasma-enhanced CVD (PECVD), physical vapor deposition (PVD), and atomic layer deposition (ALD) may be used to form the etch stop layer 104. In some embodiments, the etch stop layer 104 may have a thickness of 50-300 angstroms.

In some embodiments, the first dielectric layer 106 may made of a different material than the etch stop layer 104. The first dielectric layer 106 may be formed of a dielectric material, such as silicon nitride, silicon oxide, silicon oxynitride, or the like, having a high etching selectivity from the etching of the etch stop layer 104. By way of example but not limitation, the first dielectric layer 106 may be made of silicon oxide, and the etch stop layer 104 may be made of silicon nitride. In some embodiments, a variety of suitable processes including chemical vapor depositions (CVD), low-pressure CVD (LPCVD), plasma-enhanced CVD (PECVD), physical vapor deposition (PVD), and atomic layer deposition (ALD) may be used to form the first dielectric layer 106.

In some embodiments, the second dielectric layer 107 and/or the third dielectric layer 110 may made of a different material than the first dielectric layer 106 and the sacrificial layer 108. In some embodiments, the second dielectric layer 107 and/or the third dielectric layer 110 may be formed of a dielectric material, such as silicon nitride, silicon oxide, silicon oxynitride, or the like. By way of example but not limitation, the second dielectric layer 107 and/or the third dielectric layer 110 may be made of silicon nitride, and the sacrificial layer 108 may be made of silicon oxide. In some embodiments, the second dielectric layer 107 and/or the third dielectric layer 110 may have a thinner thickness than the first dielectric layer 106 and the sacrificial layer 108. In some embodiments, the third dielectric layer 110 may have a thicker thickness than the second dielectric layer 107. In some embodiments, a variety of suitable processes including chemical vapor depositions (CVD), low-pressure CVD (LPCVD), plasma-enhanced CVD (PECVD), physical vapor deposition (PVD), and atomic layer deposition (ALD) may be used to form the second dielectric layer 107 and/or the second capping layer 110.

The sacrificial layer 108 may have a higher etching rate than the second and third dielectric layers 107 and 110 in certain etchant used in a wet etching process. The etching selectivity ratio of the sacrificial layer 108 to the second and third dielectric layers 107 and 110 may range from 1.5 to 5.0. In some embodiments, the sacrificial layer 108 may include doped poly-Si and the second and third dielectric layers 107 and 110 may include undoped poly-Si. By way of example and not limitation, in a solution of $NH_4OH$ or tetramethylammonium hydroxide (TMAH) as a wet etchant, the etching selectivity ratio of doped poly-Si to undoped poly-Si ranges from 1.5 to 5.0. The wet-etching selectivity of $NH_4OH$ or TMAH between doped poly-Si and undoped poly-Si is dependent on the doping species, e.g., with a higher etching rate for Ar, Si, As or P, or a lower etching rate for B.

In some embodiments, the sacrificial layer 108 may be formed of a dielectric material, such as silicon nitride, silicon oxide, silicon oxynitride, or the like, having a high etching selectivity from the etching of the second and third dielectric layers 107 and 110. In some embodiments, a variety of suitable processes including chemical vapor depositions (CVD), low-pressure CVD (LPCVD), plasma-enhanced CVD (PECVD), physical vapor deposition (PVD), and atomic layer deposition (ALD) may be used to form the sacrificial layer 108.

In some embodiments, the first patterned hard mask layer 112 may include tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials. The first patterned hard mask layer 112 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 3A:
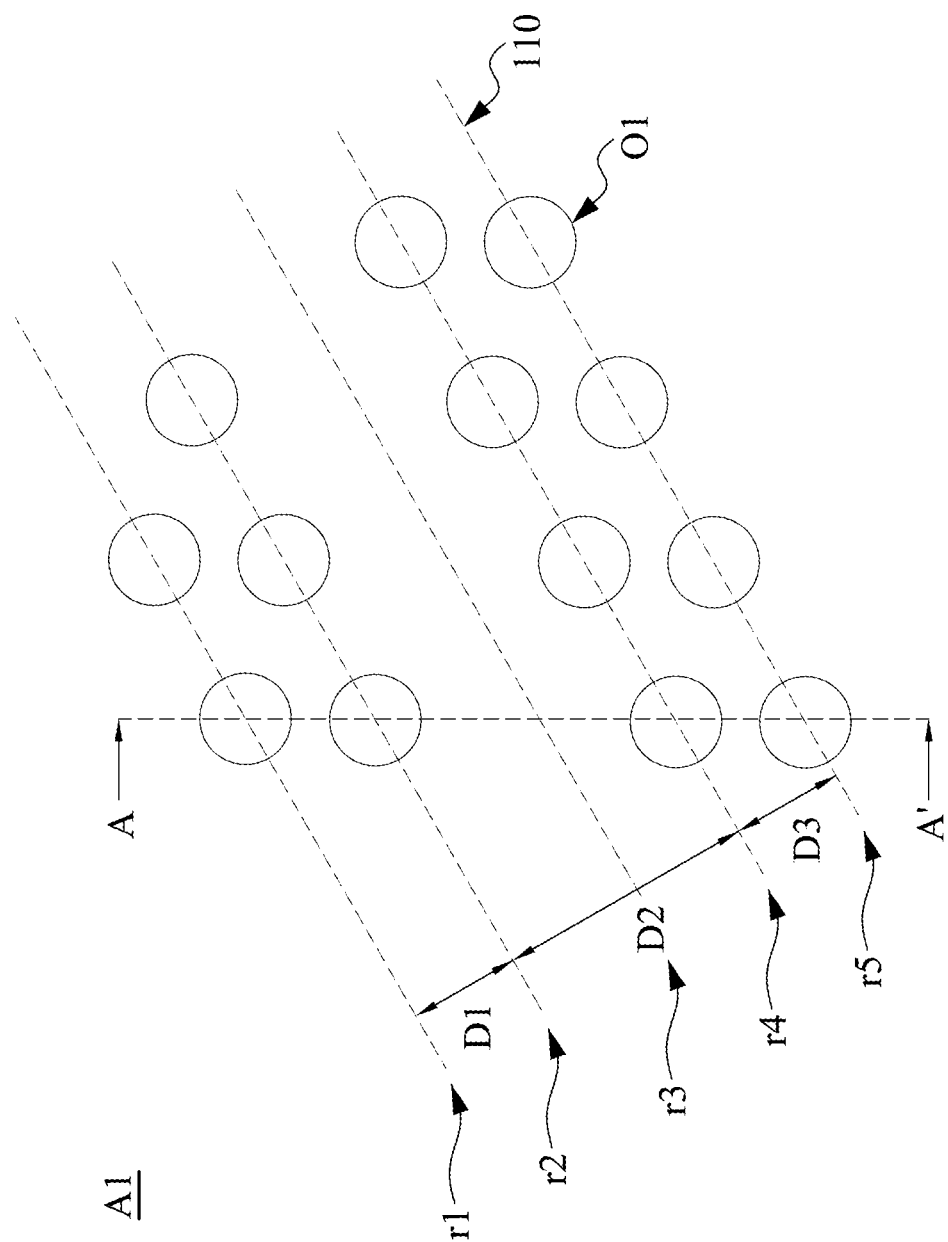
Figure 3B:
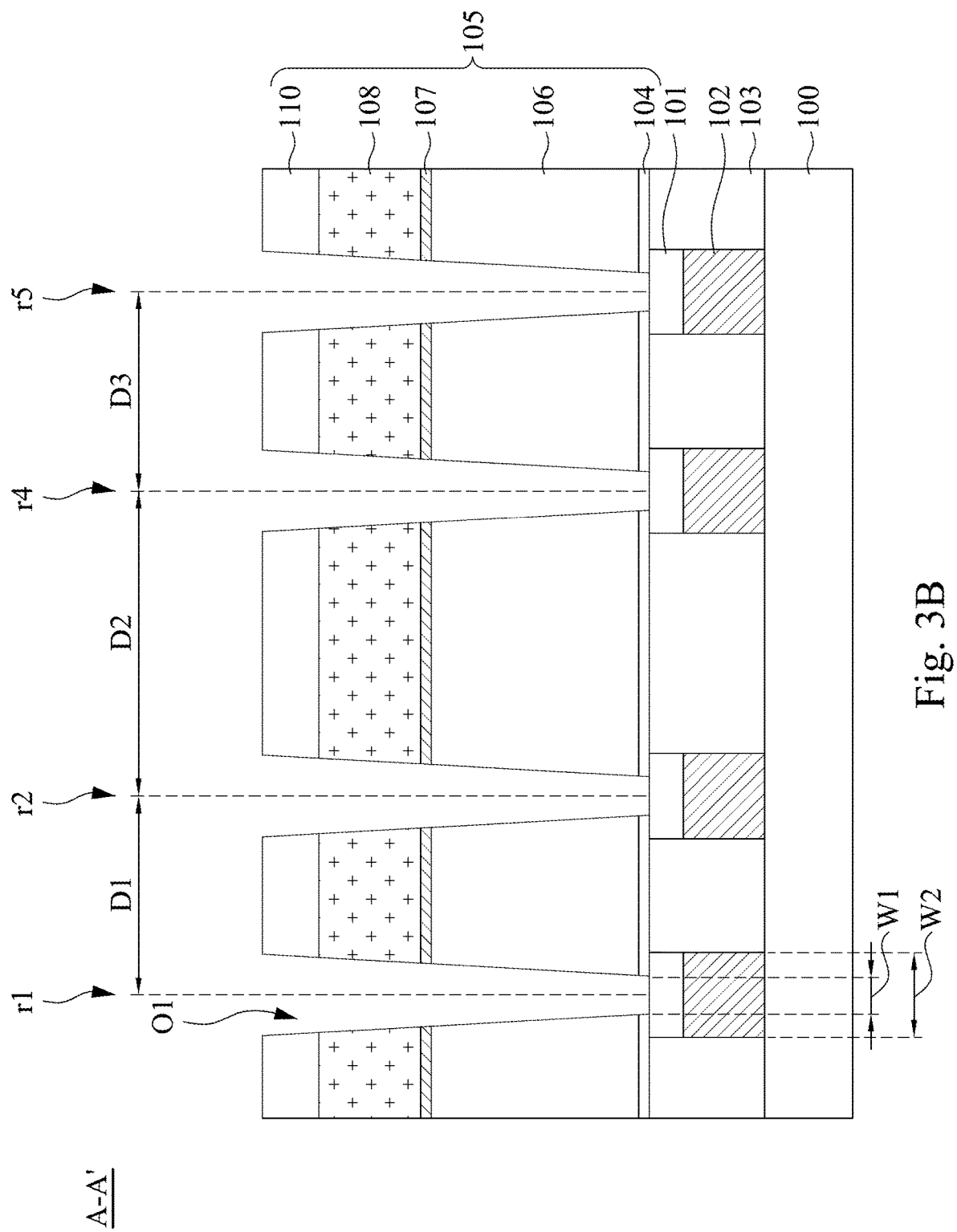

Referring back to FIG. 1, the method M then proceeds to block S103 where one or more etching processes are performed on the dielectric structure to form first openings exposing the capacitor contacts. With reference to FIGS. 3A and 3B, in some embodiments of block S103, the dielectric structure 105 is anisotropically etched and patterned using the first patterned hard mask layer 112 as an etching mask to form first openings O1 therein, wherein the first patterned hard mask layer 112 is partially consumed when the patterning is complete, and the first patterned hard mask layer 112 is removed after the etching.

As shown in FIG. 3A, the first openings O1 are arranged in rows r1, r2, r4, and r5. A distance D1 between the rows r1 and r2 is less than a distance D2 between the rows r2 and r4, and a distance D3 between the rows r4 and r5 is less than the distance D2 between the rows r2 and r4. In some embodiments, the first distance D1 may be less than one-half of the second distance D2. The third distance D3 may be less than one-half of the second distance D2. In some embodiments, the first openings O1 in the row r1 may be arranged at the same lateral spacing. The first openings O1 in the row r2 may be arranged at the same lateral spacing. The first openings O1 in the row r4 may be arranged at the same lateral spacing. The first openings O1 in the row r5 may be arranged at the same lateral spacing. The first opening O1 has a circle top-view pattern. In some embodiments, the first opening O1 may have a square top-view pattern, a rectangular top-view pattern, or an elliptical top-view pattern. As shown in FIG. 3B, the width W1 the bottom of the first opening O1 is less than the width W2 of the capacitor contacts 102 when view from a cross section.

Figure 4A:
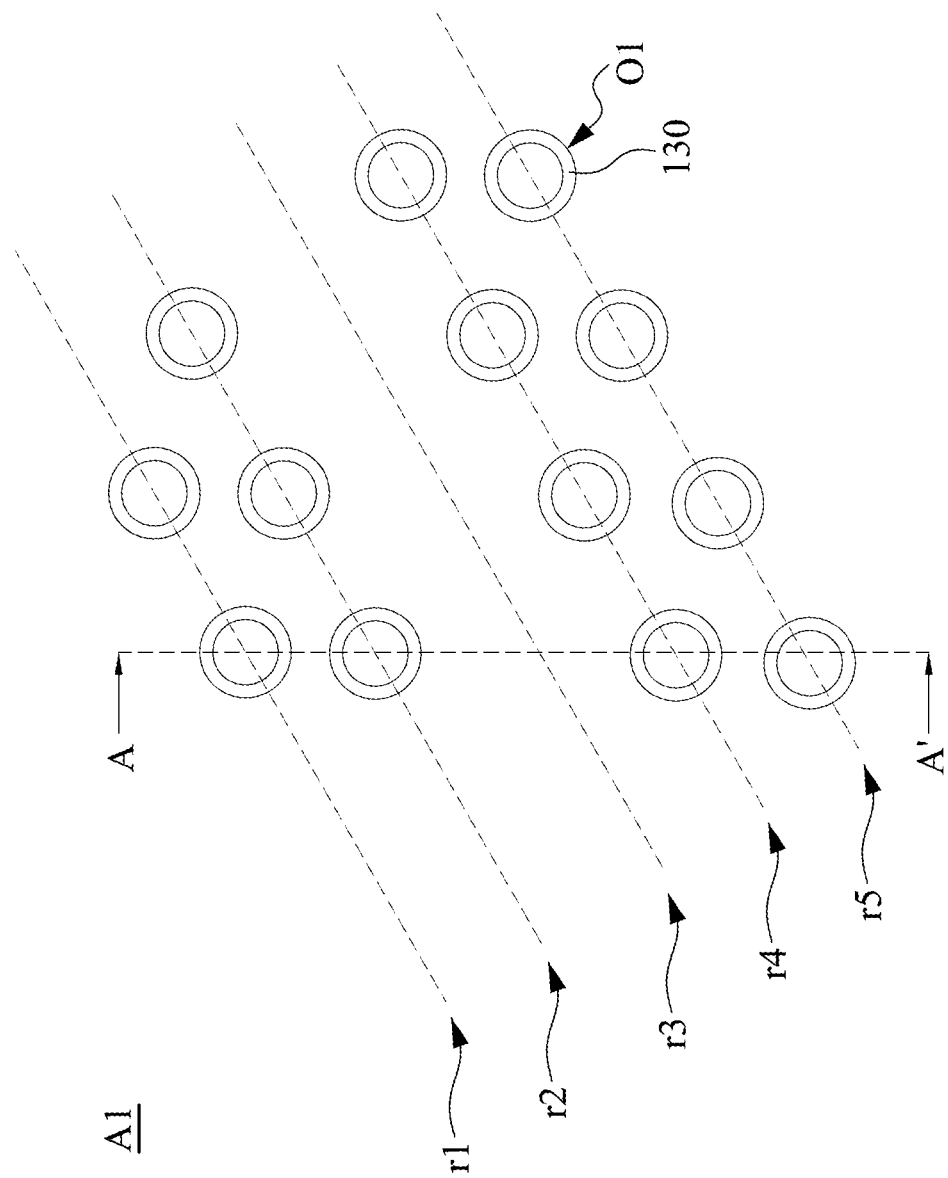
Figure 4B:
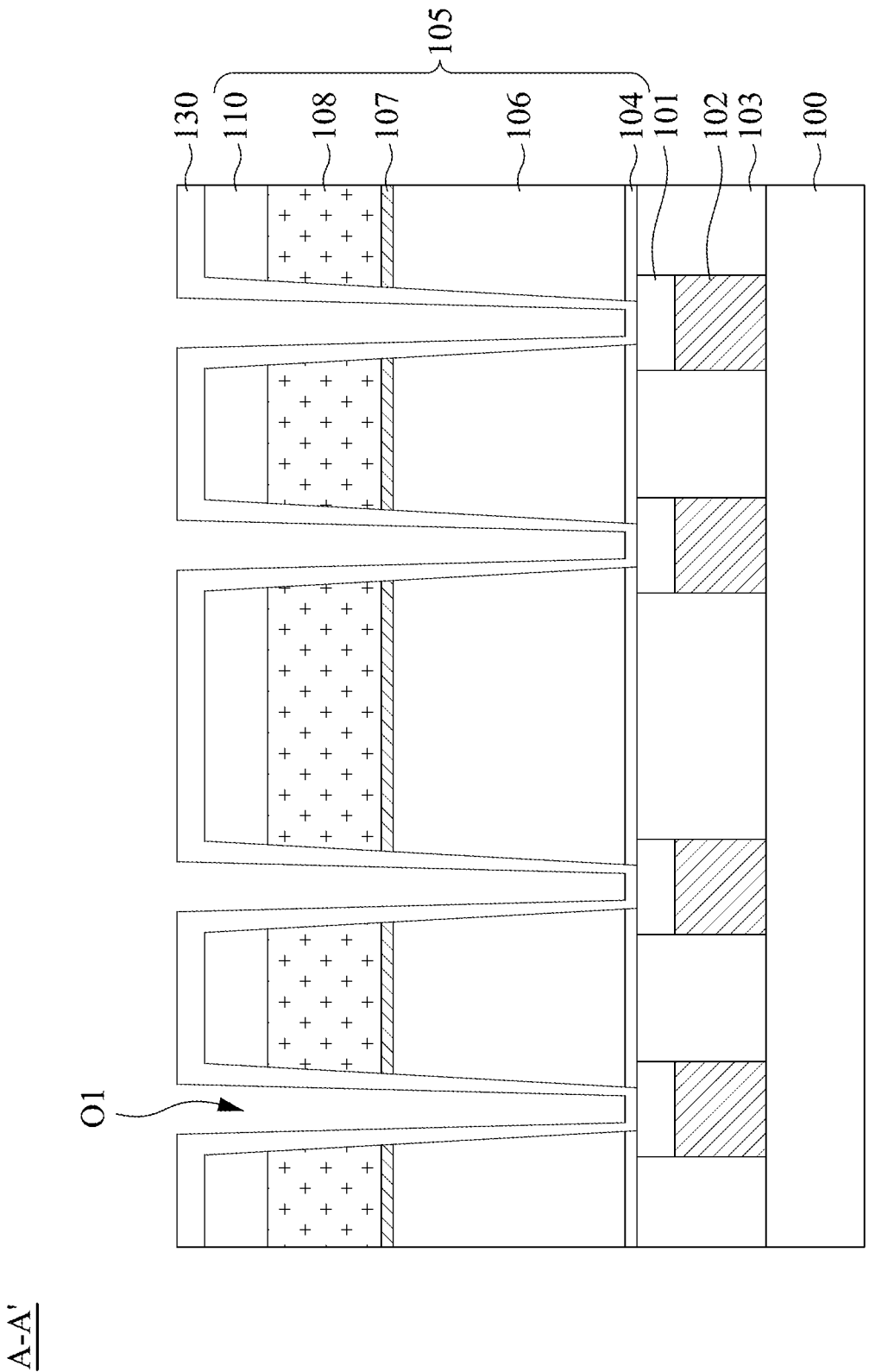

Referring back to FIG. 1, the method M then proceeds to block S104 where a bottom electrode layer of capacitors is conformally formed over the dielectric structure and in the first openings. With reference to FIGS. 4A and 4B, in some embodiments of block S104, where a bottom electrode layer 130 is conformally formed over dielectric structure 105 and the capacitor contacts 102. As shown in FIG. 4B, the bottom electrode layer 130 lines sidewalls of the first openings O1 and top surfaces of the capacitor contacts 102. In some embodiments, the bottom electrode layer 130 may include copper, Pt, Ru, aluminum, tantalum, tungsten, tantalum nitride (TaN), titanium, titanium nitride (TiN), combinations thereof, or other suitable materials. In some embodiments, a variety of suitable processes including chemical vapor depositions (CVD), low-pressure CVD (LPCVD), plasma-enhanced CVD (PECVD), physical vapor deposition (PVD), and atomic layer deposition (ALD) may be used to form the bottom electrode layer 130. In some embodiments, the bottom electrode layer 130 may be interchangeably referred to as a surface bottom plate in this context.

Figure 5A:
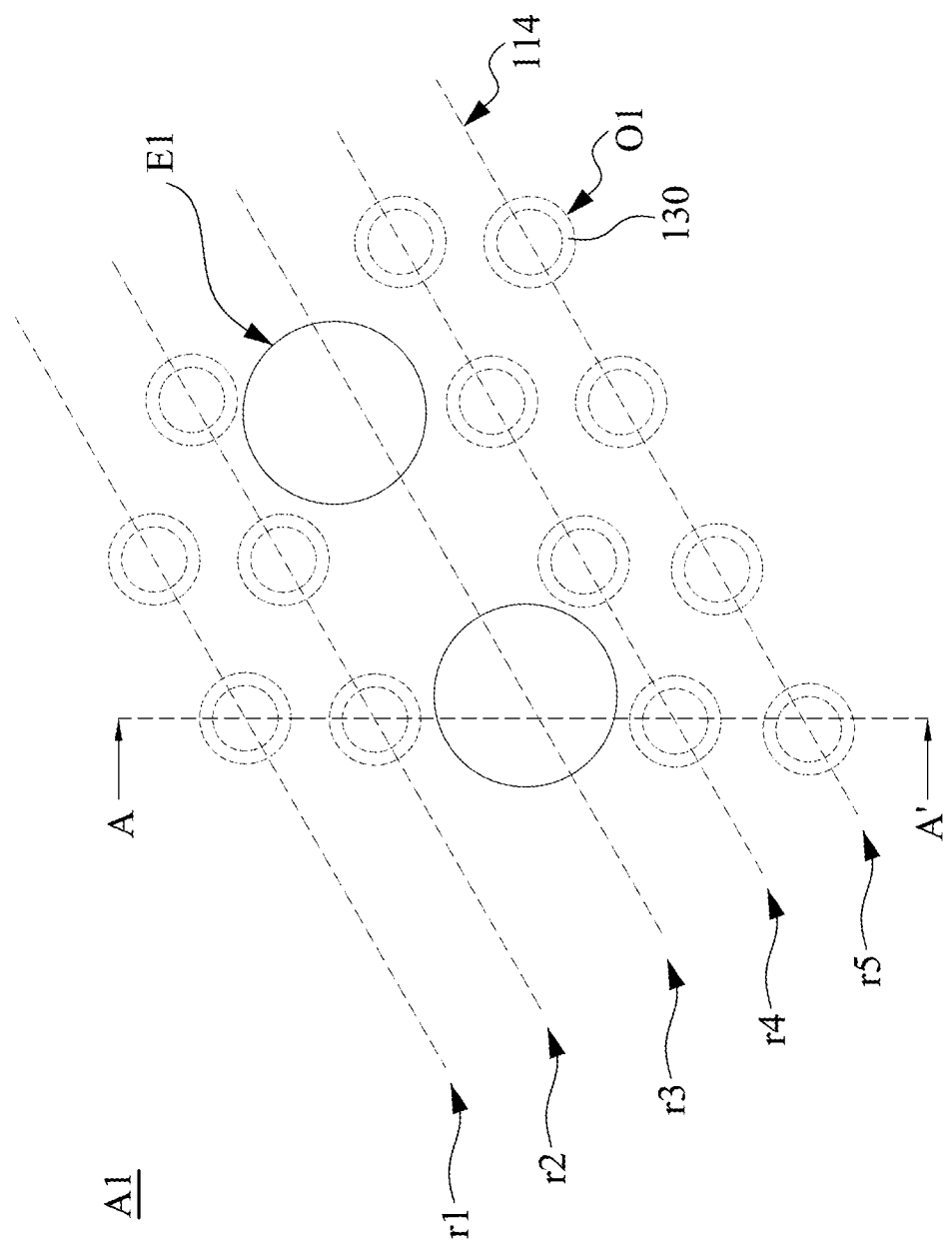
Figure 5B:
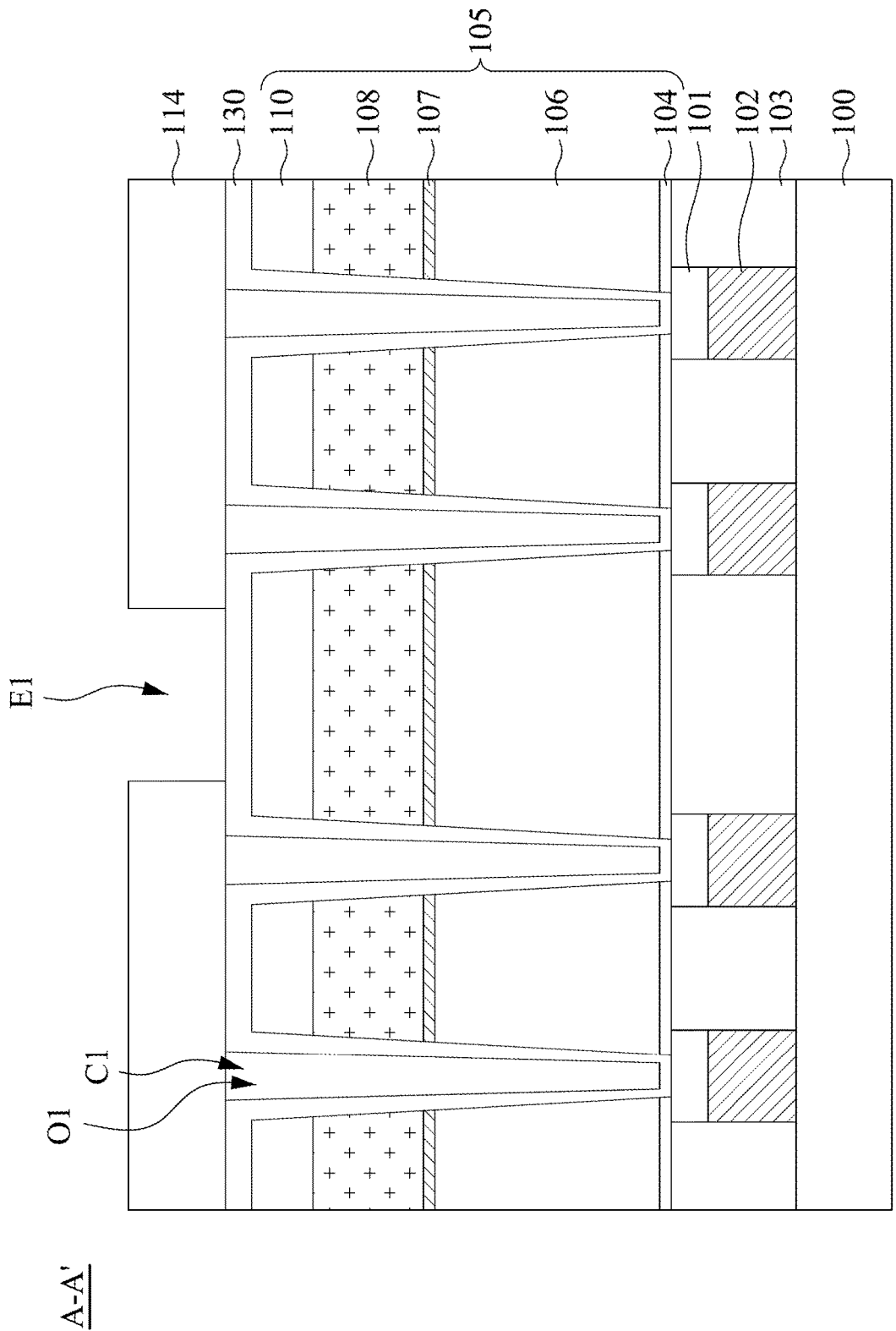

Referring back to FIG. 1, the method M then proceeds to block S105 where a patterned hard mask layer is formed over the bottom electrode layer of the capacitors, wherein at least one through hole in the patterned hard mask layer is laterally between adjacent two of the first openings and non-overlaps with the first openings. With reference to FIGS. 5A and 5B, in some embodiments of block S105, a second patterned hard mask layer 114 is formed over the bottom electrode layer 130 of the pedestal container stacked capacitors C1. The second patterned hard mask layer 114 have through holes E1 therein. The through holes E1 are laterally between adjacent two of the first openings O1 in the rows r2 and r4 and non-overlaps with the first openings O1. The through holes E1 may be used to remove the underlying bottom electrode layer 130, third dielectric layer 110, and sacrificial layer 108 in a subsequent process. As shown in FIG. 5A, the through holes E1 are arranged in a row r3. The through holes E1 have circle top-view patterns. In some embodiments, the through holes E1 may have a square top-view pattern, a rectangular top-view pattern, or an elliptical top-view pattern.

In some embodiments, the second patterned hard mask layer 114 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), silicon oxide, silicon nitride, and/or other suitable dielectric materials. The second patterned hard mask layer 114 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 6A:
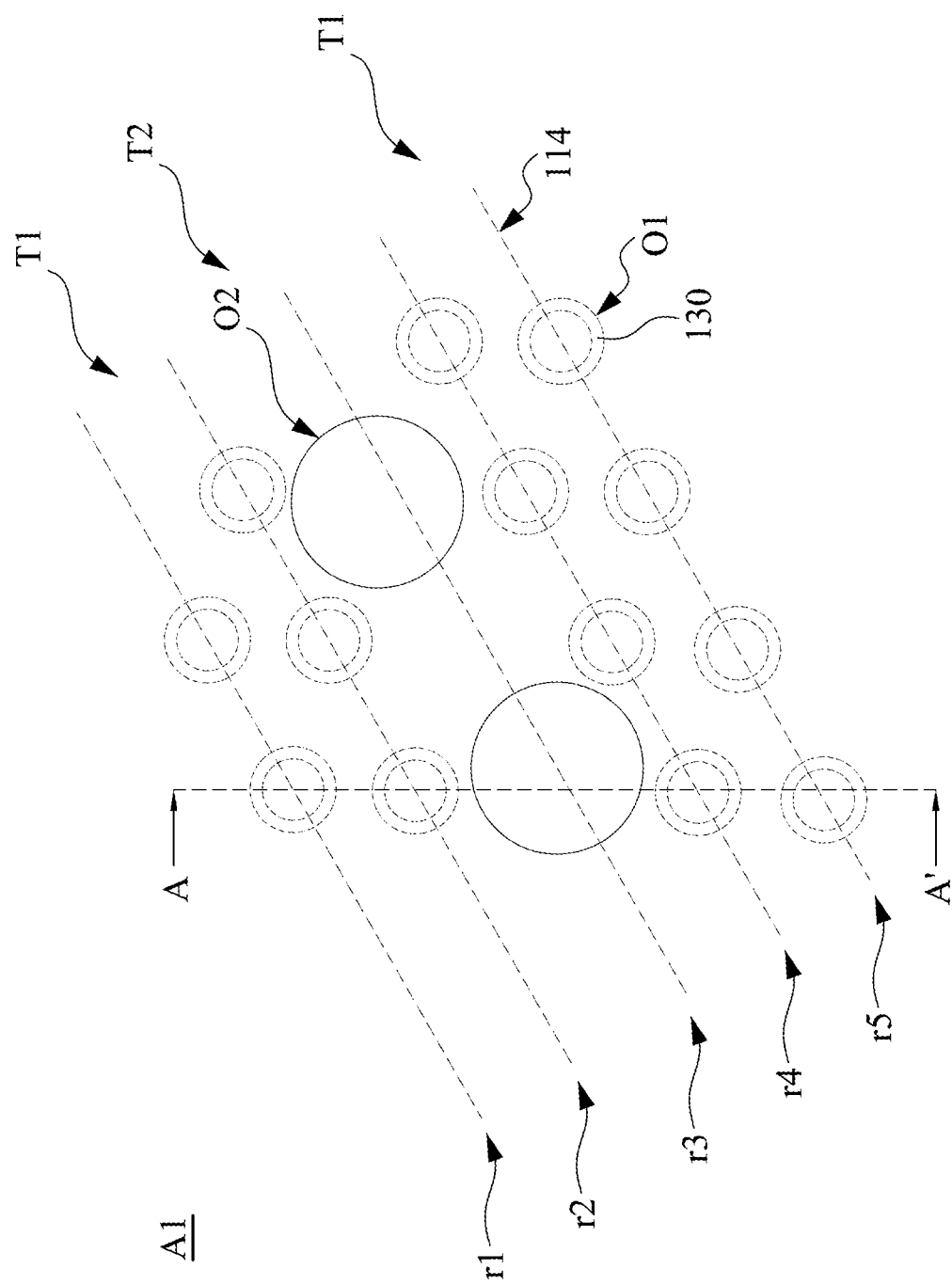
Figure 6B:
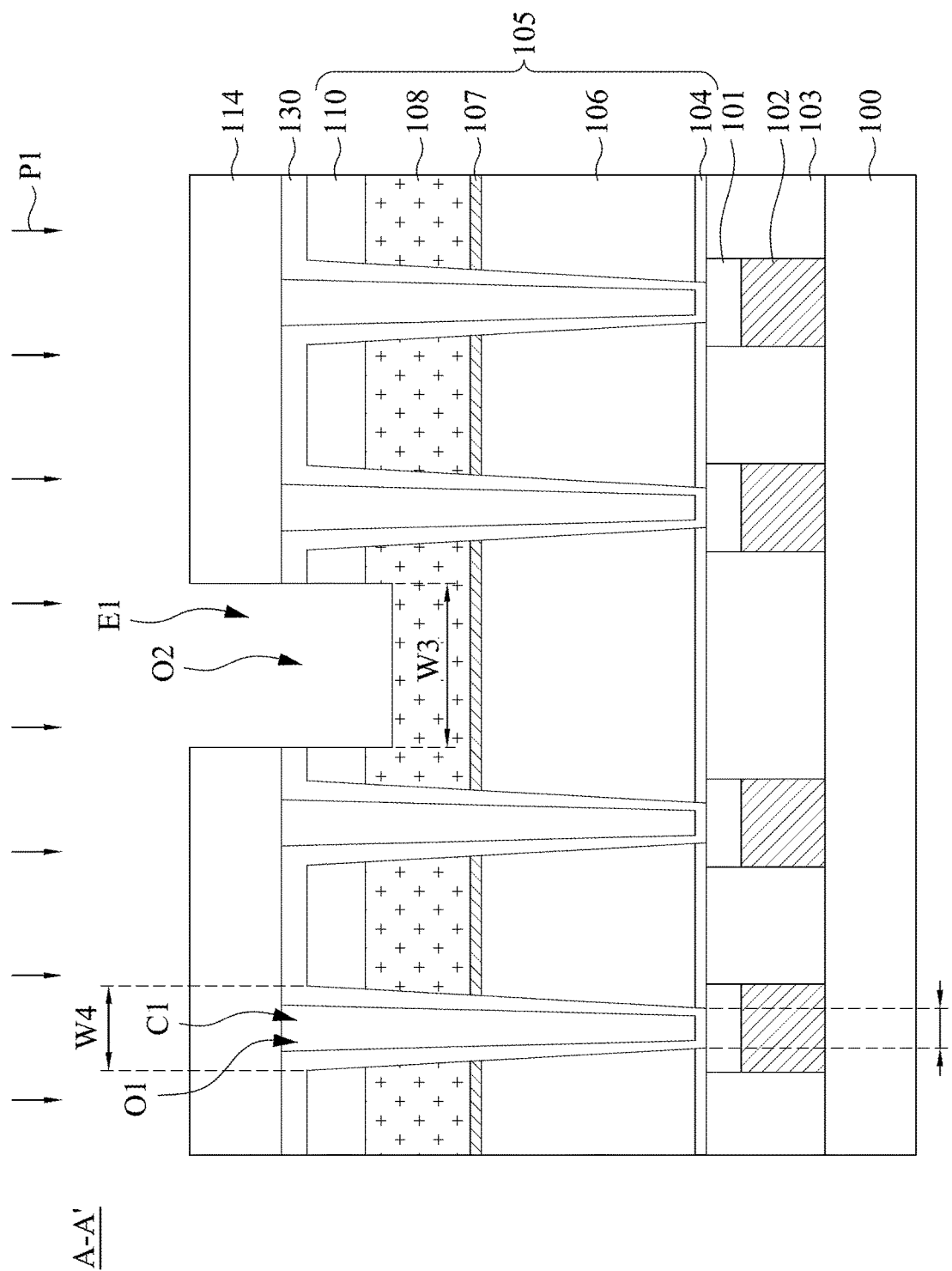

Referring back to FIG. 1, the method M then proceeds to block S106 where one or more etching processes are performed on an upper portion of the dielectric structure to form at least one second opening through the patterned hard mask layer. With reference to FIGS. 6A and 6B, in some embodiments of block S106, one or more etching processes P1 is performed on the underlying bottom electrode layer 130, third dielectric layer 110, and sacrificial layer 108 to form second openings O2 through the second patterned hard mask layer 114. In some embodiments, the etching process P1 may be performed to etch thorough the third dielectric layer 110 and further etch on the sacrificial layer 108 and terminating prior to reaching the second dielectric layer 107. In some embodiments, the etching process P1 may be performed to etch thorough the third dielectric layer 110 and further etch on the sacrificial layer 108 until the second dielectric layer 107 is exposed.

As shown in FIGS. 6A and 6B, the second opening O2 is laterally between adjacent two of the first openings O1 and non-overlaps with the first openings O1 and the capacitor contacts 102. Specifically, the capacitor array A1 has a capacitor pattern-dense region T1 and a capacitor pattern-sparse region T2. The second openings O2 used to remove the sacrificial layer 108 of the dielectric stack 105 in the subsequent process are formed in the capacitor pattern-sparse region T2 to prevent the second openings O2 from forming above the capacitor contacts 102. As a result, during the third dielectric layer 110 is etched to form the openings O2, the bottom electrode layers 130 formed above the capacitor contacts 102 will not be damaged by the etching process P1, which in turn improves the capacitance of the pedestal container stacked capacitors C1.

As shown in FIG. 6B, the second opening O2 having a width W3 greater than the width W1 of the bottom of the first opening O1 and the width W4 of the top of the first opening O1 when view from the cross section. As shown in FIG. 6A, the second opening O2 are arranged in the row r3 in parallel with and between the rows r2 and r4. The second opening O2 has a circle top-view pattern. In some embodiments, the second opening O2 may have a square top-view pattern, a rectangular top-view pattern, or an elliptical top-view pattern.

In some embodiments, the etching process P1 may include dry etching, wet etching, and/or other etching methods (e.g., reactive ion etching). In some embodiments, the underlying bottom electrode layer 130, sacrificial layer 108, and third dielectric layer 110 are anisotropically etched and patterned using the second patterned hard mask layer 114 as an etching mask to form the second opening O2 therein, wherein the second patterned hard mask layer 114 is partially consumed when the patterning is finished, and the second patterned hard mask layer 114 is removed after the etching. In some embodiments, the etching process P1 may be an anisotropic dry etching process (e.g., a reactive-ion etching process, RIE or atomic layer etching (ALE)). By way of example and not limitation, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 7A:
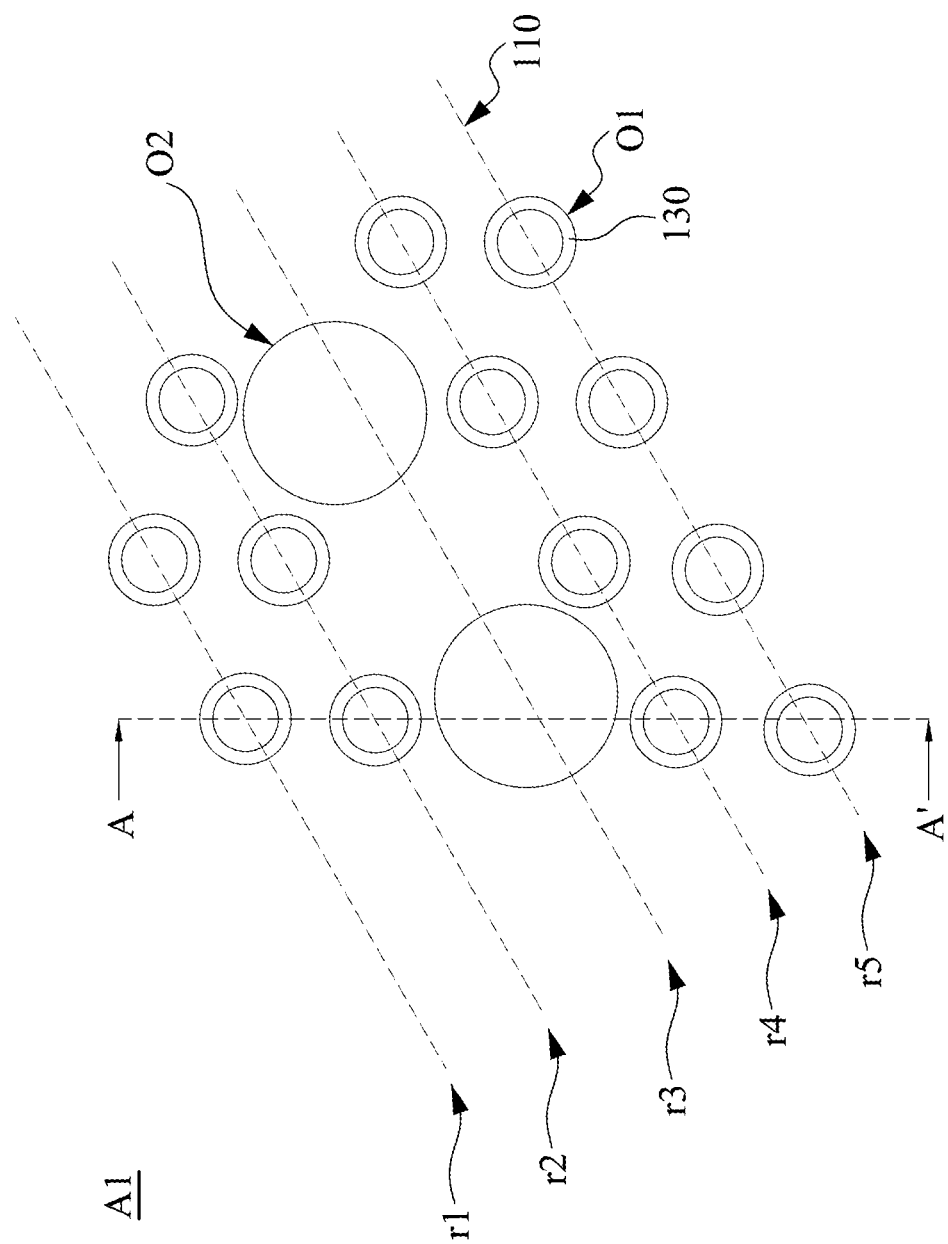
Figure 7B:
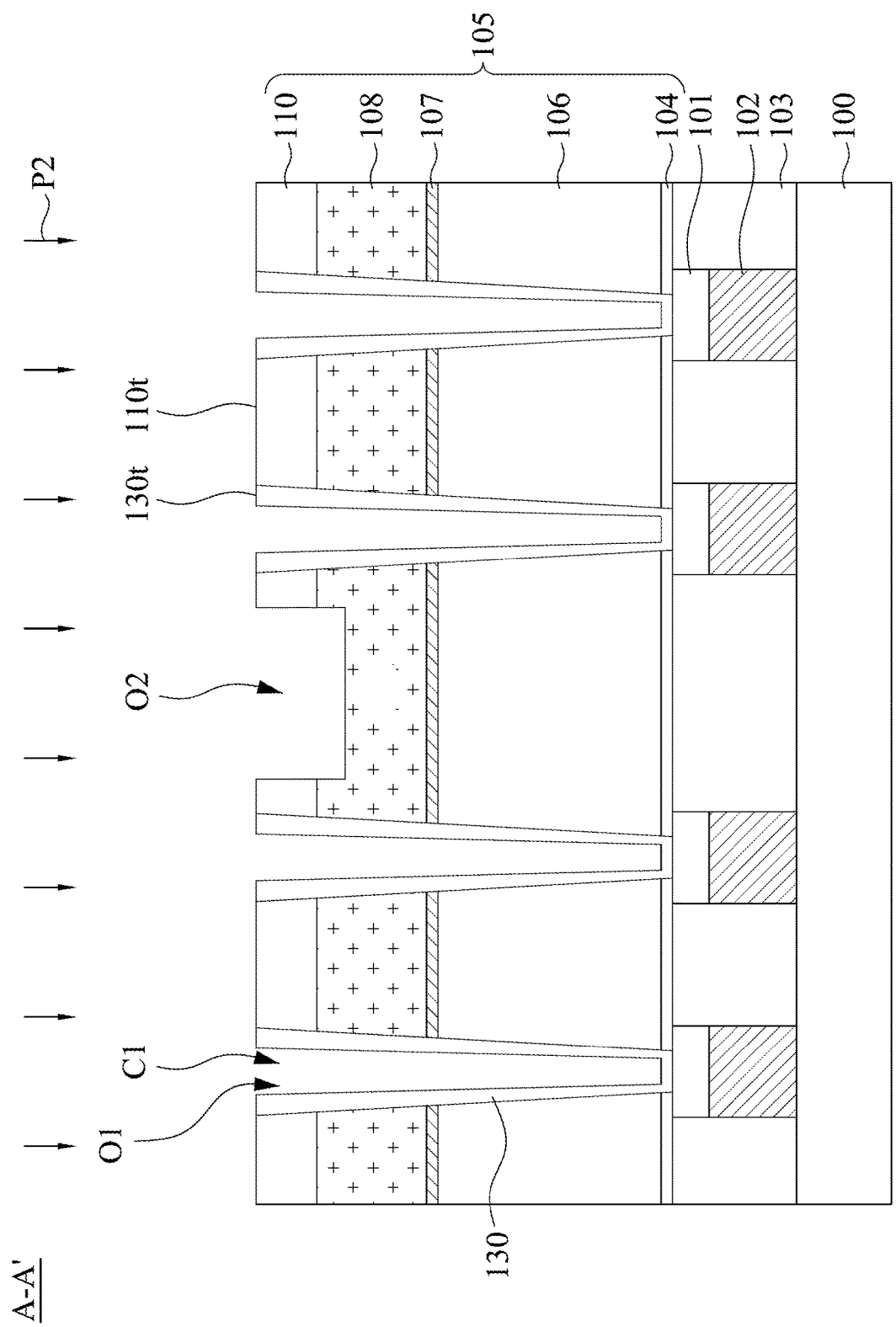

Referring back to FIG. 1, the method M then proceeds to block S107 where a planarization process is performed on the patterned hard mask layer and the bottom electrode layer until the dielectric structure is exposed. With reference to FIGS. 7A and 7B, in some embodiments of block S107, a planarization process P2, such as chemical mechanical polish (CMP), is performed to remove the second patterned hard mask layer 114 and the excess bottom electrode layer 130 over the dielectric structure 105 until the third dielectric layer 110 is exposed.

In such embodiments, the third dielectric layer 110 may act as the CMP stop layer in the planarization. In greater detail, the CMP process uses slurry that removes the bottom electrode layer 130 at a faster removal rate than it removes the material of the third dielectric layer 110 (e.g., silicon nitride). After the planarization process P2 is complete, the bottom electrode layer 130 may have an U-shaped cross section, and the third dielectric layer 110 may have a top surface 110t level with a top surface 130t of the bottom electrode layer 130.

Figure 8A:
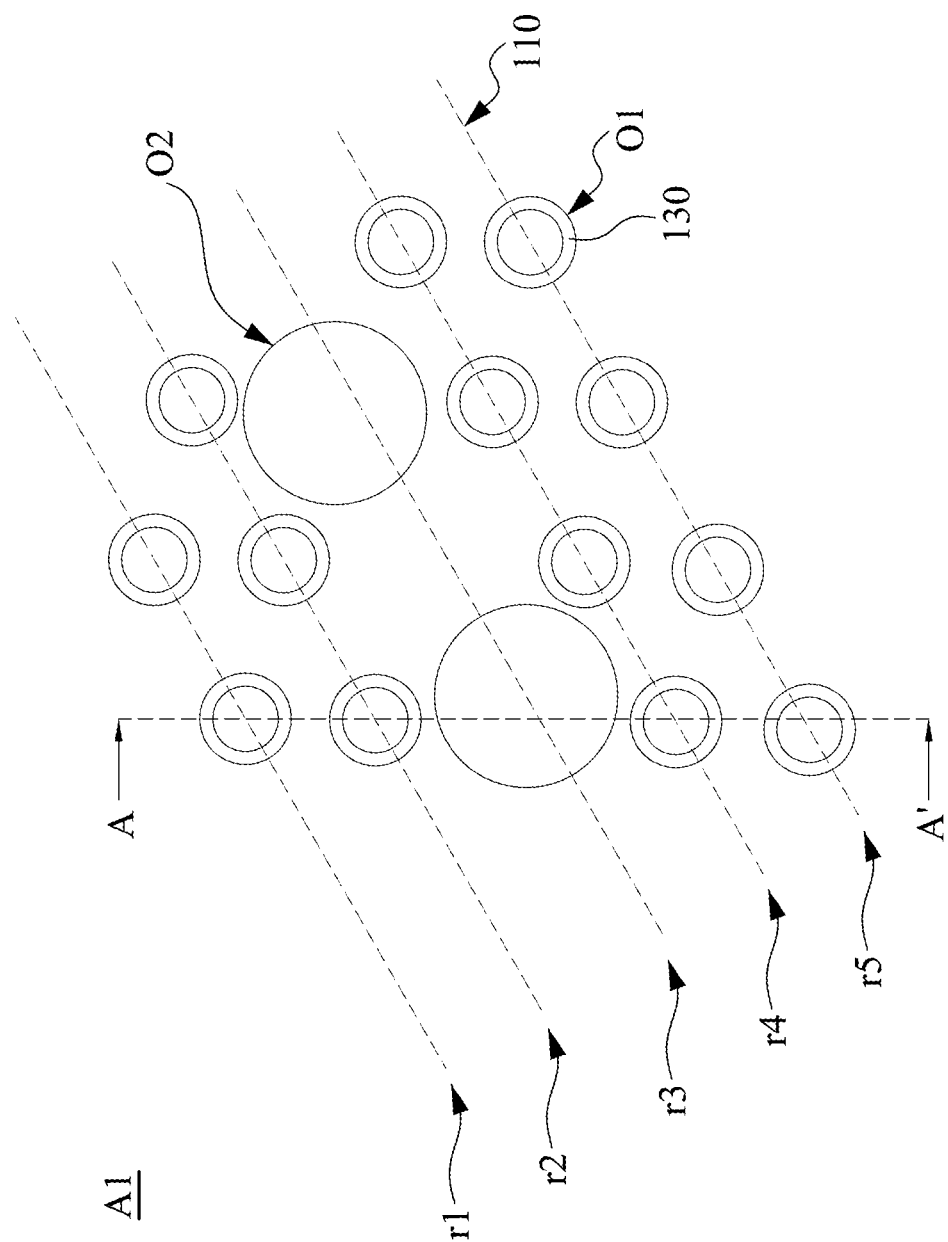
Figure 8B:
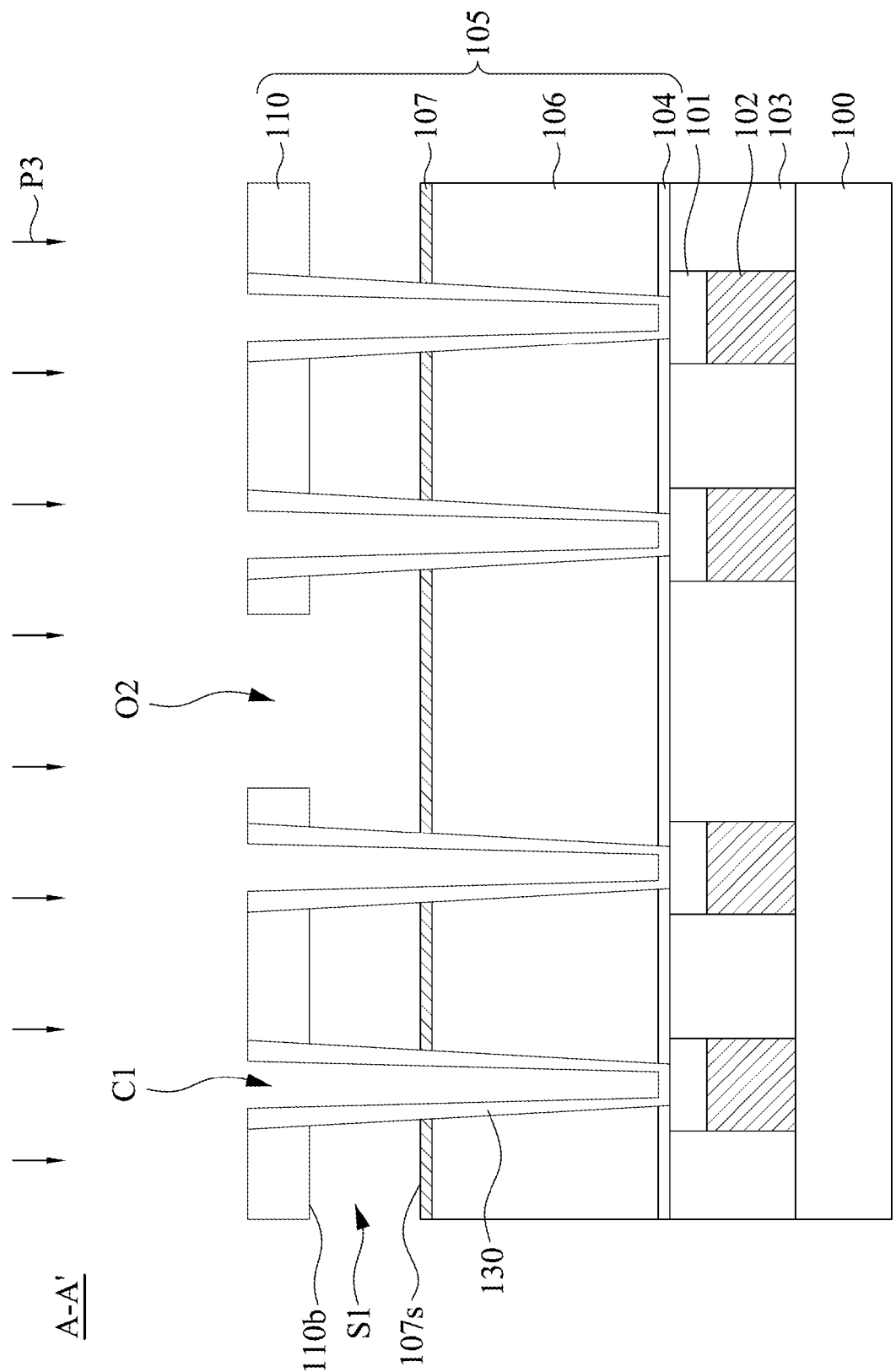

Referring back to FIG. 1, the method M then proceeds to block S108 where a sacrificial layer in the dielectric structure and laterally surrounding the first openings is removed through the second opening. With reference to FIGS. 8A and 8B, in some embodiments of block S108, the remainder of the sacrificial layer 108 in the dielectric structure 105 is removed to form a space S1 between the second and third dielectric layers 107 and 110, such that a top surface 107s of the second dielectric layer 107 and a bottom surface 110b of the third dielectric layer 110 are exposed from the space S1.

In some embodiments, the sacrificial layer 108 is removed by an etching process P3. In some embodiments, etching resistances of the second and third dielectric layers 107 and 110 may be greater than an etching resistance of the sacrificial layer 108. Stated another way, the etching process P3 is a selective etching process that etches the sacrificial layer 108 at a faster etch rate than it etches the second and third dielectric layers 107 and 110. In some embodiments, the sacrificial layer 108 may be removed by a wet etching process. In some embodiments, the sacrificial layer 108 is removed by an etching operation, in which diluted HF, SiCoNi (including HF and $NH_3$), or the like, may be used as the etchant. For example, If the sacrificial layer 108 is formed of silicon nitride, the sacrificial layer 108 may be remove by a wet process using diluted HF.

Figure 9A:
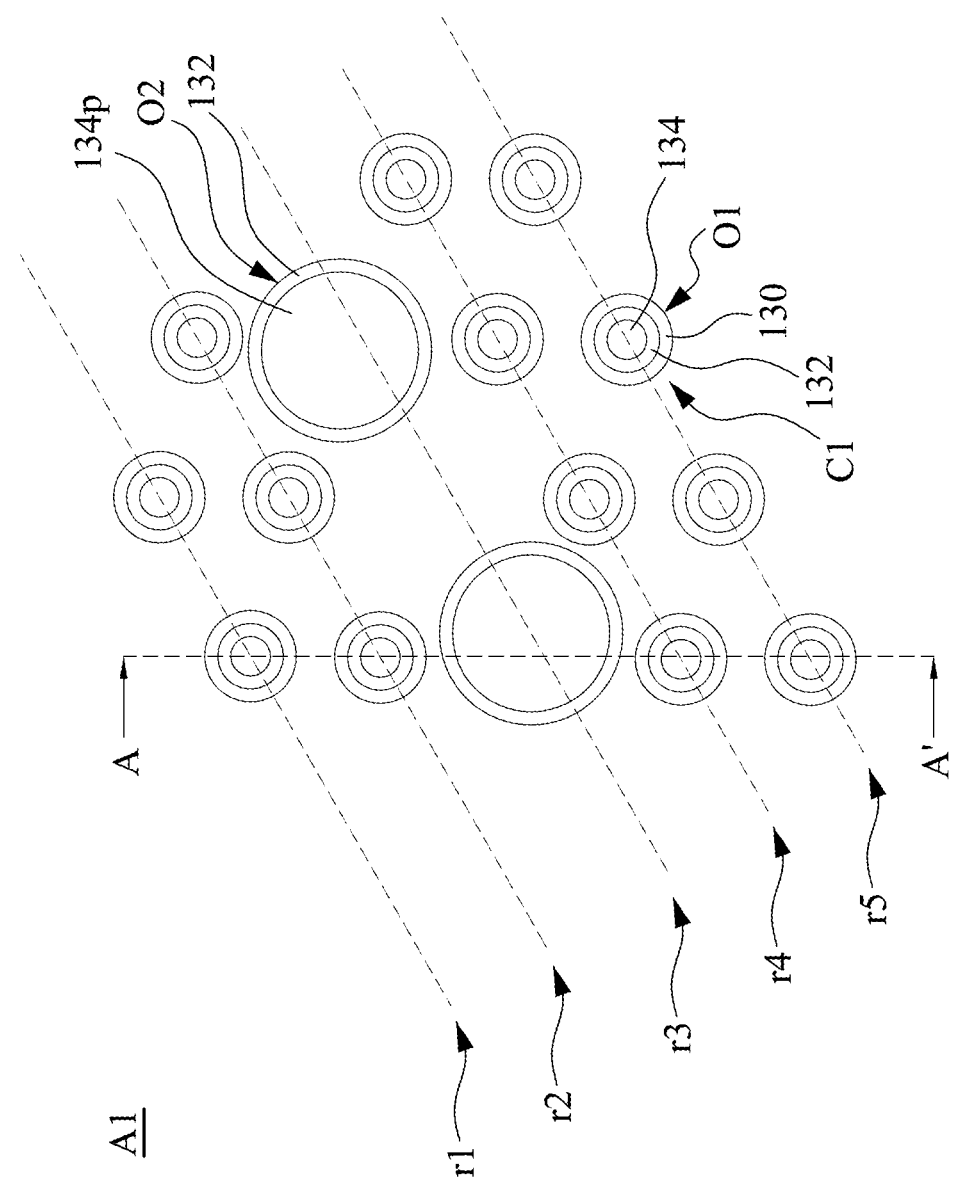
Figure 9B:
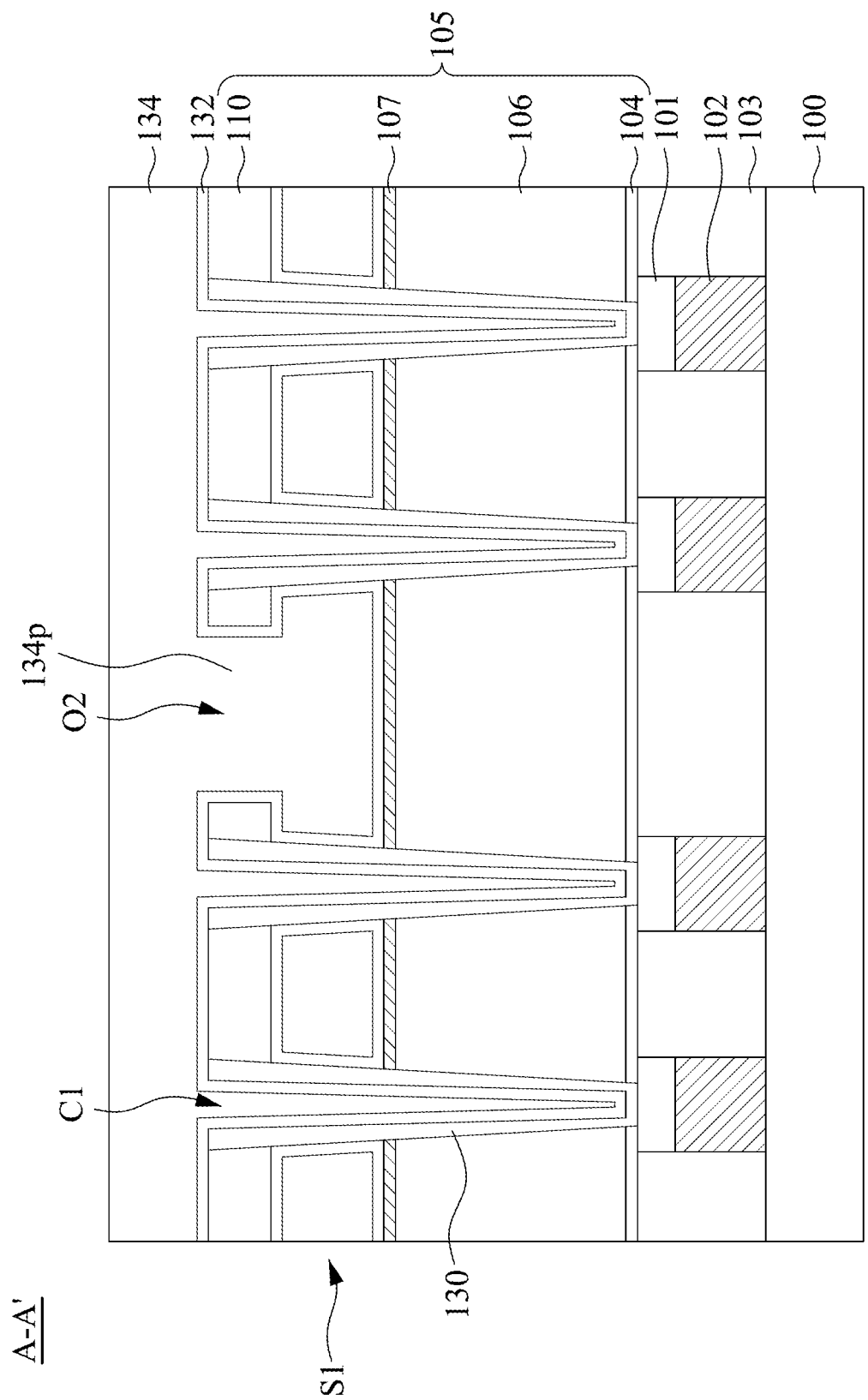

Referring back to FIG. 1, the method M then proceeds to block S109 where a capacitor dielectric layer is formed over the bottom electrode layer. With reference to FIGS. 9A and 9B, in some embodiments of block S109, a capacitor dielectric layer 132 is conformally formed over the bottom electrode layer 130. The capacitor dielectric layer 132 may include a high-K material, such as aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_2$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof. In some embodiments, a variety of suitable processes including chemical vapor depositions (CVD), low-pressure CVD (LPCVD), plasma-enhanced CVD (PECVD), physical vapor deposition (PVD), and atomic layer deposition (ALD) may be used to form the capacitor dielectric layer 132.

Referring back to FIG. 1, the method M then proceeds to block S110 where a top electrode layer is formed over the capacitor dielectric layer. With reference to FIGS. 9A and 9B, in some embodiments of block S110, a top electrode layer 134 is formed over the capacitor dielectric layer 132 and in the space S1 between the second and third dielectric layers 107 and 110 to laterally surround the pedestal container stacked capacitors C1.

As shown in FIG. 9B, the top electrode layer 134 has a portion 134p penetrates through the third dielectric layer 110. The portion 134p has a greater dimension than a portion of the top electrode layer 134 directly above the capacitor contact 102 from a top view. In some embodiments, the dimension of the portion 134p may be in a range from about 1.5 to about 10 times (e.g. about 1.5, 2, 3, 4, 5, 6, 7, 8, 9, or 10) the dimension of the portion of top electrode layer 134 directly above the capacitor contact 102 from the top view. In some embodiments, a distance between adjacent two of the portions 134p in the same row may be greater than a distance between adjacent two of the pedestal container stacked capacitors C1 in the same row. In some embodiments, a distance between the portion 134p and an adjacent one of the pedestal container stacked capacitors C1 may be less than a distance between adjacent two of the pedestal container stacked capacitors C1 in the same row.

As shown in FIG. 9A, the portions 134p of the top electrode layer 134 are arranged in the row r3 in parallel with and between the rows r2 and r4. The portion 134p of the top electrode layer 134 has a circle top-view pattern. In some embodiments, the portion 134p of the top electrode layer 134 may have a square top-view pattern, a rectangular top-view pattern, or an elliptical top-view pattern.

Therefore, the pedestal container stacked capacitors C1 are formed to extend upwardly from above the substrate 100 and arranged in the rows r1, r2, r4, and r5. In some embodiments, there is free of any pedestal container stacked capacitors between the rows r1 and r2 of the pedestal container stacked capacitors C1, free of any pedestal container stacked capacitors between the rows r2 and r4 of the pedestal container stacked capacitors C1, and free of any pedestal container stacked capacitors between the rows r4 and r5 of the pedestal container stacked capacitors C1. In some embodiments, the pedestal container stacked capacitors C1 in the row r1 may be arranged at the same lateral spacing (see FIG. 9A), the pedestal container stacked capacitors C1 in the row r2 may be arranged at the same lateral spacing, and the pedestal container stacked capacitors C1 in the row r4 may be arranged at the same lateral spacing. The pedestal container stacked capacitors C1 in the row r5 may be arranged at the same lateral spacing.

In some embodiments, the top electrode layer 134 may include copper, Pt, Ru, aluminum, tantalum, tungsten, tantalum nitride (TaN), titanium, titanium nitride (TiN), combinations thereof, or other suitable materials. In some embodiments, the top electrode layer 134 may include a metallic material. In some embodiments, the top electrode layer 134 may include a doped poly-Si layer. In some embodiments, a variety of suitable processes including chemical vapor depositions (CVD), low-pressure CVD (LPCVD), plasma-enhanced CVD (PECVD), physical vapor deposition (PVD), and atomic layer deposition (ALD) may be used to form the top electrode layer 134. In some embodiments, the top electrode layer 134 may be interchangeably referred to as a surface top plate in this context.

Based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a capacitor array with pedestal container stacked capacitors. A method for fabrication of the capacitors includes forming a dielectric stack having two dielectric layers and a sacrificial layer between the two dielectric layers over capacitor contacts prior to forming the capacitors; and forming bottom electrode layers of the capacitors penetrating through the dielectric stack to land on the capacitor contacts. In order to increasing cell capacitance, the sacrificial layer will be removed through openings set on the upper dielectric layer in the stack and overlapping the capacitor contacts, which in turn increases the space to further fill the bottom electrode material of the capacitors therein to improve the capacitance. However, during the upper dielectric layer is etched to form the openings, the bottom electrode layers formed above the capacitor contacts may be damaged by the etching process, which in turn decreases the capacitance of the capacitors.

Therefore, the present disclosure in various embodiments provides a capacitor array having a capacitor pattern-dense region and a capacitor pattern-sparse region. The openings used to remove the sacrificial layer of the dielectric stack are formed in the capacitor pattern-sparse region to prevent the openings from forming above the capacitor contacts. As a result, during the upper dielectric layer is etched to form the openings, the bottom electrode layers formed above the capacitor contacts will not be damaged by the etching process, which in turn improves the capacitance of the capacitors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A capacitor array, comprising:
   a substrate;
   a plurality of first pedestal container stacked capacitors extending upwardly from above the substrate and arranged in a first row;
   a plurality of second pedestal container stacked capacitors extending upwardly from above the substrate and arranged in a second row next to the first row; and
   a plurality of third pedestal container stacked capacitors extending upwardly from above the substrate and arranged in a third row next to the second row, a first distance between the first and second rows being less than a second distance between the second and third rows, wherein each of the first, second, and third pedestal container stacked capacitors includes a bottom electrode layer having a U-shaped cross section, a capacitor dielectric layer above the bottom electrode layer, and a top electrode layer above the capacitor dielectric layer; and
   a first dielectric layer laterally surrounding upper portions of the first, second, and third pedestal container stacked capacitors,
   wherein the top electrode layer of one of the second pedestal container stacked capacitors downwardly extends to penetrate the first dielectric layer to a space below the first dielectric layer and laterally surrounds a perimeter of a middle portion of the bottom electrode layer of the one of the second pedestal container stacked capacitors, and the top electrode layer of the one of the second pedestal container stacked capacitors has a penetrating portion in the first dielectric layer and having a circle top view pattern.

2. The capacitor array of claim 1, further comprising a plurality of fourth pedestal container stacked capacitors extending upwardly from above the substrate and arranged in a fourth row next to the third row, a third distance between the third and fourth rows being less than the second distance between the second and third rows.

3. The capacitor array of claim 2, wherein the first distance is less than one-half of the second distance.

4. The capacitor array of claim 1, wherein the plurality of first pedestal container stacked capacitors in the first row are arranged at a same spacing.

5. The capacitor array of claim 1, wherein the plurality of second pedestal container stacked capacitors in the second row are arranged at a same spacing.

6. The capacitor array of claim 1, wherein the penetrating portion of the top electrode layer of the one of the plurality of second pedestal container stacked capacitors is located at a position laterally between the second and third rows.

7. The capacitor array of claim 1, wherein a top surface of the first dielectric layer is level with a top surface of the bottom electrode layer of the one of the plurality of second pedestal container stacked capacitors.

8. The capacitor array of claim 1, further comprising a second dielectric layer laterally surrounding lower portions of the first, second, and third pedestal container stacked capacitors and being spaced apart from the first dielectric layer.

9. The capacitor array of claim 1, further comprising:
   a capacitor contact between the one of the second pedestal container stacked capacitors and the substrate, wherein the capacitor contact has a wider width than the bottom electrode layer of the one of the second pedestal container stacked capacitors.

10. The capacitor array of claim 9, wherein the penetrating portion of the top electrode layer of the one of the second pedestal container stacked capacitors in the first dielectric layer non-overlaps the capacitor contact.

* * * * *